United States Patent
Inoue et al.

(10) Patent No.: US 6,673,674 B2
(45) Date of Patent: Jan. 6, 2004

(54) METHOD OF MANUFACTURING A SEMICONDUCTOR DEVICE HAVING A T-SHAPED FLOATING GATE

(75) Inventors: Ken Inoue, Tokyo (JP); Hiroshi Sugawara, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/924,472

(22) Filed: Aug. 9, 2001

(65) Prior Publication Data

US 2002/0003276 A1 Jan. 10, 2002

Related U.S. Application Data

(62) Division of application No. 09/241,609, filed on Feb. 2, 1999, now abandoned.

(30) Foreign Application Priority Data

Feb. 10, 1998  (JP) ............................................ 10-028142

(51) Int. Cl.[7] ............................................ H01L 21/336
(52) U.S. Cl. ....................... 438/257; 438/182; 438/256; 438/258
(58) Field of Search .................... 257/314–326; 438/182, 257–267

(56) References Cited

U.S. PATENT DOCUMENTS

| | | | | |
|---|---|---|---|---|
| 4,740,484 A | * | 4/1988 | Norstrom et al. | 257/754 |
| 4,807,013 A | * | 2/1989 | Manocha | 257/755 |
| 4,951,103 A | | 8/1990 | Esquivel et al. | |
| 5,200,350 A | | 4/1993 | Gill et al. | |
| 5,567,651 A | * | 10/1996 | Berti et al. | 148/DIG. 147 |
| 5,637,897 A | | 6/1997 | Oyama | |
| 5,648,673 A | | 7/1997 | Yasuda | |
| 5,677,556 A | | 10/1997 | Endoh | |
| 5,897,354 A | | 4/1999 | Kachelmeier | |
| 5,998,829 A | | 12/1999 | Choi et al. | |

FOREIGN PATENT DOCUMENTS

| | | | |
|---|---|---|---|
| EP | 0780902 | 6/1997 | |
| EP | 0811983 | 12/1997 | |
| JP | 6130063 | 2/1986 | |
| JP | 6245165 | 2/1987 | |
| JP | 287578 | 3/1990 | |
| JP | 823041 | 1/1996 | |
| JP | 8107158 | 4/1996 | |
| JP | 08107158 A | * 4/1996 | ....... H01L/21/8247 |
| JP | 955442 | 2/1997 | |
| JP | 9102554 | 4/1997 | |
| JP | 9283643 | 10/1997 | |
| JP | 9312351 | 12/1997 | |
| JP | 1012750 | 1/1998 | |

OTHER PUBLICATIONS

"A 1.28$\mu m^2$ Contactless Memory Cell Technology for a 3V–Only 64Mbit EEPROM," H. Keme, et al., 1992 IEDM Tech. Dig., pp. 991–993.

"A 0.4–$\mu m^2$ Self–Aligned Contactless Memory Cell Technology Suitable for 256–Mbit Flash Memories," M. Kato et al., 1994 IEDM Tech. Dig., pp. 921–923.

* cited by examiner

*Primary Examiner*—Long Pham
*Assistant Examiner*—Nathan W. Ha
(74) *Attorney, Agent, or Firm*—Young & Thompson

(57) ABSTRACT

In a semiconductor device having a plurality of memory cells, each of the memory cells includes a floating gate, a control gate, a source and drain, and a silicide layer. The floating gate is formed on a semiconductor substrate of a first conductivity type through a gate insulating film to be insulated from a surrounding portion. The control gate is formed on the floating gate through an ONO film. The source and drain are formed on the semiconductor substrate on two sides of the floating gate and doped with an impurity of a second conductivity type. The silicide layer is formed on a surface of at least one of the drain and source. A method of manufacturing the semiconductor device is also disclosed.

5 Claims, 6 Drawing Sheets

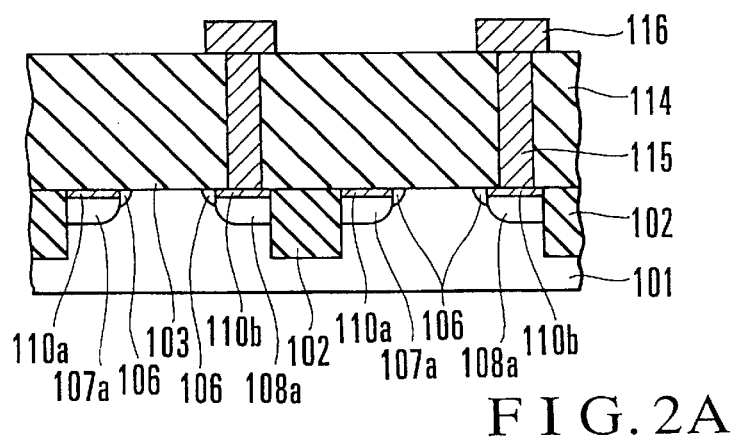
F I G. 2A
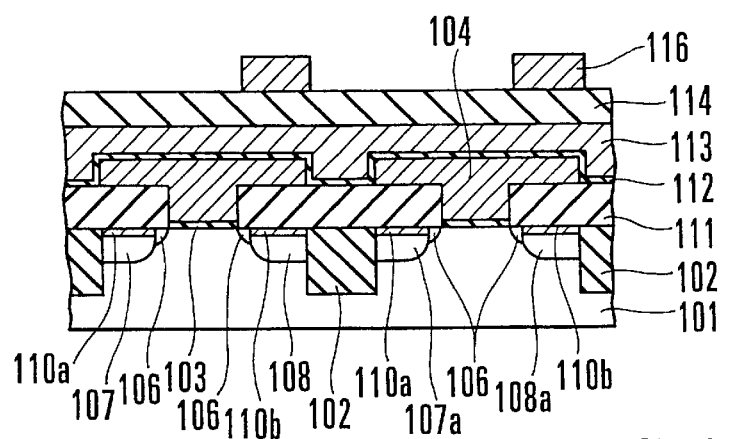
F I G. 2B
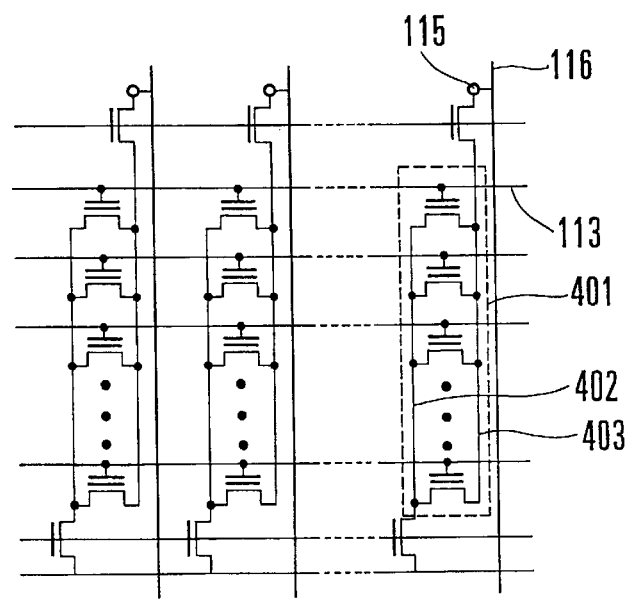
F I G. 3

METHOD OF MANUFACTURING A SEMICONDUCTOR DEVICE HAVING A T-SHAPED FLOATING GATE

This application is a division of co-pending application Ser. No. 09/241,609, filed on Feb. 2, 1999 now abandoned, the entire contents of which are hereby incorporated by reference.

BACKGROUND OF THE INVENTION

The present invention relates to a semiconductor device having a memory cell with a floating gate, and a method of manufacturing the same.

A conventional, general flash memory will be described with reference to FIG. 4 and FIGS. 5A and 5B.

In the memory cell of the flash memory shown in FIGS. 5A and 5B, floating gates 503 are formed on a semiconductor substrate 501 through gate insulating films 502. Each floating gate 503 has a T-shaped section and an upper portion extending horizontally. This shape increases the capacity of the floating gate 503.

A source 504 and drain 505 are formed on the two sides of the insulating film 502 of the semiconductor substrate 501, and element regions are defined and isolated by isolation oxide films 506 for element isolation. A control gate 508 is formed on the floating gates 503 through an ONO film 507. The control gate 508 forms part of a word line. The source 504 and drain 505 are formed in common for the plurality of floating gates 503, and the commonly formed drain 505 is used as part of a bit line.

As shown in FIGS. 4 and 5A, the flash memory has a plurality of memory cells defined by the isolation oxide films 506 in the direction of gate length. The plurality of floating gates 503 are regularly arranged to be spaced apart from each other at predetermined distances in a direction perpendicularly intersecting the direction of gate length, thereby forming a memory cell array comprising the plurality of memory cells. As shown in FIGS. 4 and 5B, the common drain 505 used as part of the bit line is connected at the end portion of one memory cell to a bit interconnection 511 through a contact 509. The bit interconnection 511 is formed on the control gate 508 through an interlevel insulating film 510.

In the planar arrangement of the flash memory shown in FIG. 4, the plurality of control gates 508 are formed to be elongated in the direction of length of the gates, and are arranged in parallel to each other to connect the corresponding memory cell rows of the respective memory cell arrays. The plurality of pairs of source 504 and drain 505 are formed to be elongated in the direction perpendicularly intersecting the gate length, and are arranged in parallel to each other to correspond to the memory cell arrays.

As described above, in the conventional flash memory, the source 504 and drain 505 are formed in common for the plurality of memory cells. The drain 505 is used as part of the bit line, and one contact to be connected to the bit line is arranged for the plurality of memory cells. Therefore, the gaps among the memory cells can be decreased in the direction of gate length, and the cell size can be reduced.

In a flash memory loaded in, e.g., a microcomputer, a higher read speed is required to cope with the microcomputer that operates at a high speed. As described above, in a cell array in which a drain is used in common for a plurality of memory cells and a contact is connected to one portion of the plurality of memory cells, the drain region has a sheet resistance of as high as 100 Ω/□, which becomes a high drain resistance for a memory cell far from the contact, to interfere with the high-speed operation.

SUMMARY OF THE INVENTION

It is an object of the present invention to provide a semiconductor device that can operate at a higher speed, and a method of manufacturing the same.

In order to achieve the above object, according to the present invention, there is provided a semiconductor device having a plurality of memory cells, each of the memory cells comprising a floating gate formed on a semiconductor substrate of a first conductivity type through a gate insulating film to be insulated from a surrounding portion, a control gate formed on the floating gate through an isolation insulating film, a first source and first drain formed on the semiconductor substrate on two sides of the floating gate and doped with an impurity of a second conductivity type, and a first silicide layer formed on a surface of at least one of the first drain and first source.

BRIEF DESCRIPTION OF THE DRAWINGS

FIGS. 1A to 1J' are views showing the steps in a method of manufacturing a semiconductor device according to an embodiment of the present invention, in which FIGS. 1A to 1J are sectional views of a memory cell formation region, and FIGS. 1A' to 1J' are sectional views of the peripheral circuit region of the memory cell formation region;

FIGS. 2A and 2B are respectively sectional views of the main parts of the semiconductor device formed in accordance with the steps of FIGS. 1A to 1J';

FIG. 3 is an equivalent circuit diagram of the semiconductor device formed in accordance with the steps of FIGS. 1A to 1J';

DESCRIPTION OF THE PREFERRED EMBODIMENTS

The present invention will be described in detail with reference to the accompanying drawings.

Figure 1A:
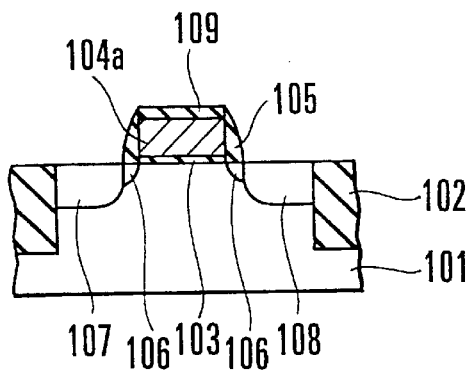
Figure 1A:
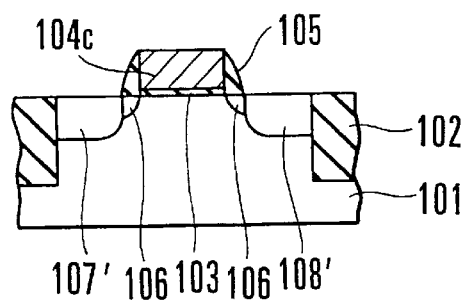
Figure 4:
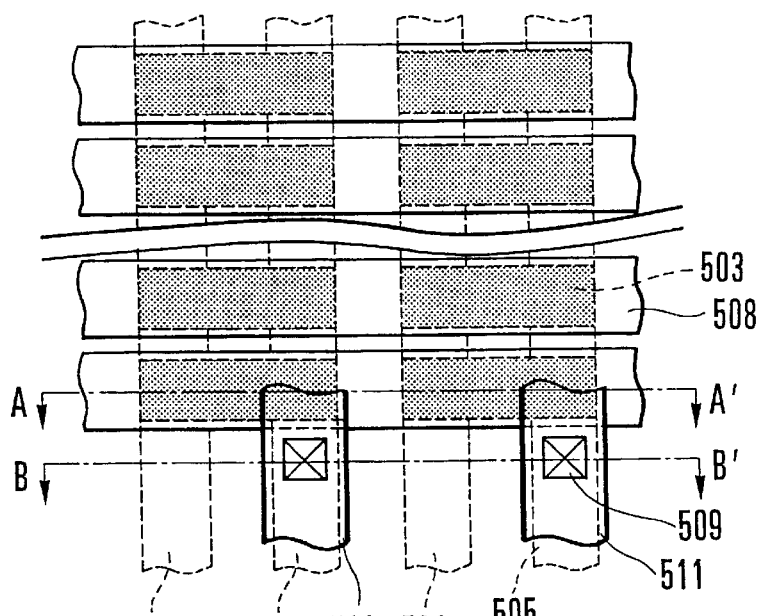
FIG. 4 is a plan view of the memory cell of a conventional, general flash memory.
Figure 5A:
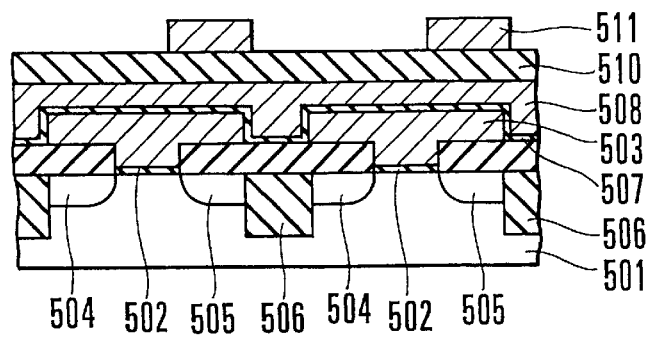
FIGS. 5A and 5B are sectional views taken along the lines A–A' and B–B', respectively.
Figure 5B:
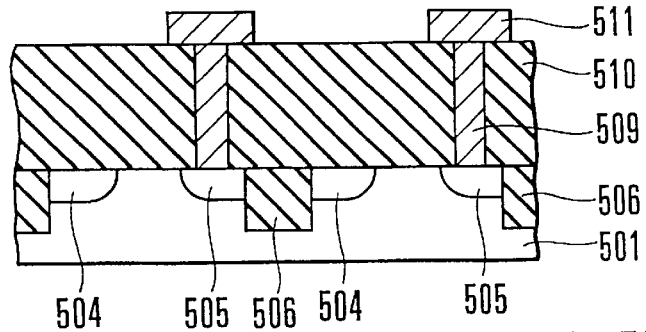

FIGS. 1A to 1J' show the steps in manufacturing a semiconductor device according to an embodiment of the present invention, in which FIGS. 1A to 1J show a memory cell formation region constituting a flash memory cell, and FIGS. 1A' to 1J' show the peripheral circuit region of the memory cell formation region. Since the planar arrangement of the flash memory cell is identical to that of FIG. 4, a description thereof will be omitted.

First, as shown in FIG. 1A, the following structure is formed in a region on a semiconductor substrate 101 which is defined by element isolation regions 102. This structure is part of a transistor having a floating gate constituting a memory cell, and is constituted by a lower electrode 104a, lightly doped regions 106, and a source 107 and drain 108. The lower electrode 104a is formed on a gate insulating film 103. The lightly doped regions 106 are formed under side walls 105 formed on the side walls of the lower electrode 104a. The source 107 and drain 108 are impurity regions formed to be continuous to the lightly doped regions 106.

In this embodiment, the semiconductor substrate 101 has a p-type conductivity, the lightly doped regions 106 are regions lightly doped with an n-type impurity, and the source 107 and drain 108 are regions doped with an n-type impurity. A protection film 109 made of silicon nitride is formed on the lower electrode 104a made of polysilicon.

The lower electrode 104a is formed by forming a film made of an electrode material and patterning this film by using a known photolithography technique or the like. Accordingly, when an insulating film made of a silicon nitride is formed on the electrode material film to a predetermined thickness and is thereafter patterned in the manner described above, the protection film 109 is formed on the lower electrode 104a, as shown in FIG. 1A.

The side walls 105 made of an insulator is formed by forming an insulating film on the lower electrode 104a to a predetermined thickness and thereafter etching back the insulating film by dry etching having vertical anisotropy.

In the peripheral circuit region formed around the memory cell formation region, as shown in FIG. 1A', a transistor having a lower electrode corresponding to the lower electrode 104a of FIG. 1A as a gate electrode 104c is formed simultaneously. Therefore, in this peripheral circuit region, the protection film 109 should not be formed on the gate electrode 104c. In other words, an insulating film made of silicon nitride described above and serving as the protection film 109 may not be formed in this region.

Figure 1B:
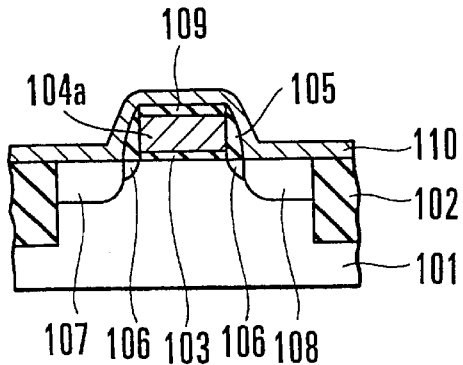
Figure 1B:
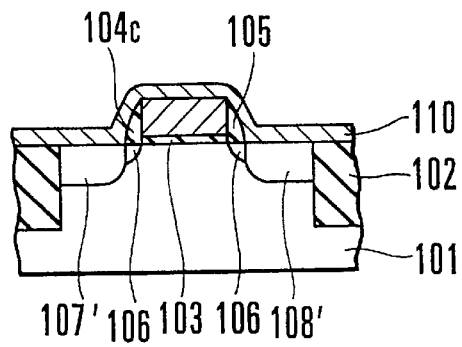
Figure 1C:
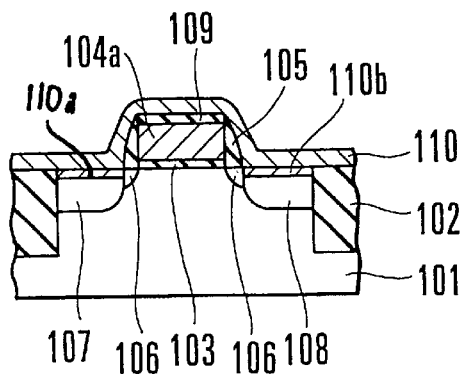
Figure 1C:
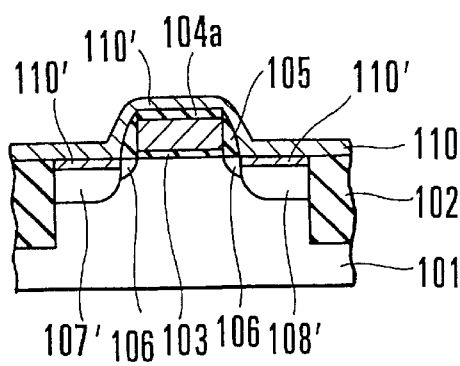

As shown in FIG. 1B, a cobalt film 110 is formed on the entire surface of the semiconductor substrate 101. At this time, the cobalt film 110 is formed on the peripheral circuit region as well, as shown in FIG. 1B'. In this state, the silicide region which is in direct contact with the cobalt film 110 is silicidized by heating or the like, thereby forming silicide layers 110a and 10b on the surfaces of the source 107 and drain 108, as shown in FIG. 1C.

At this time, although no silicide layer is formed on the lower electrode 104a due to the presence of the protection film 109, a silicide layer 110' is formed on the gate electrode 104c in the peripheral circuit region due to the absence of the protection film 109. As shown in FIG. 1C', silicide layers 110' are formed on the surfaces of source 107' and drain 108' on the two sides of the gate electrode 104c as well.

Figure 1D:
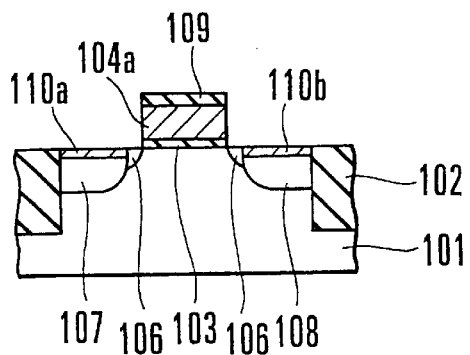
Figure 1D:
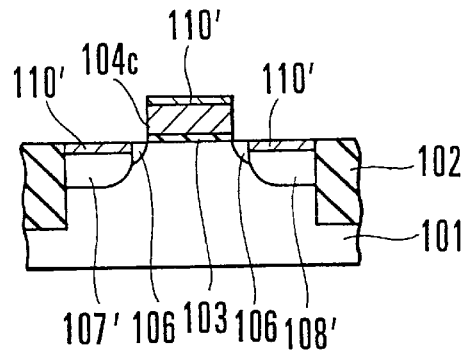
Figure 1E:
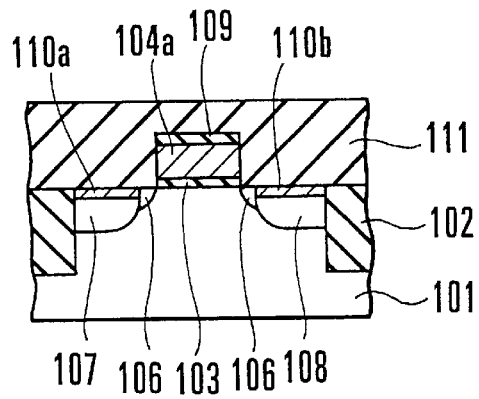
Figure 1E:
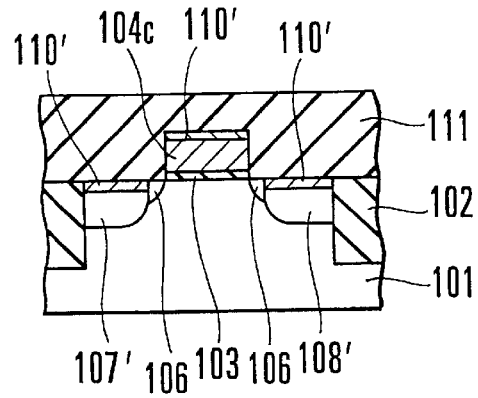

As shown in FIGS. 1D and 1D', the cobalt film 110 is removed, and as shown in FIGS. 1E and 1E', an interlevel film 111 made of silicon oxide is formed on the semiconductor substrate 101.

Figure 1F:
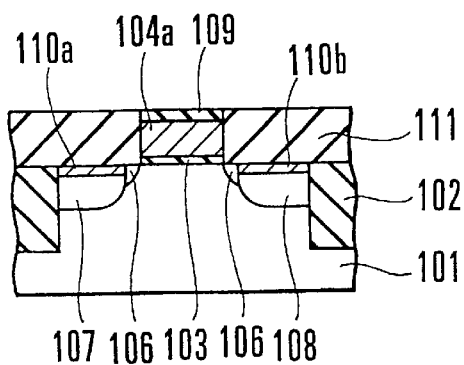
Figure 1F:
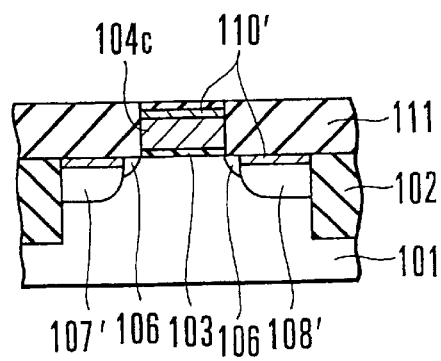

As shown in FIG. 1F, the interlevel film 111 is etched back by using chemical mechanical polishing until the surface of the protection film 109 is exposed. As shown in FIG. 1F', since the interlevel film 111 remains on the gate electrode 104c in the peripheral circuit region on which the silicide layer 110a is formed, the silicide layer 110' is not exposed.

Figure 1G:
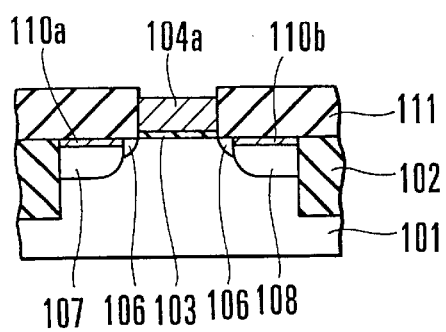
Figure 1G:
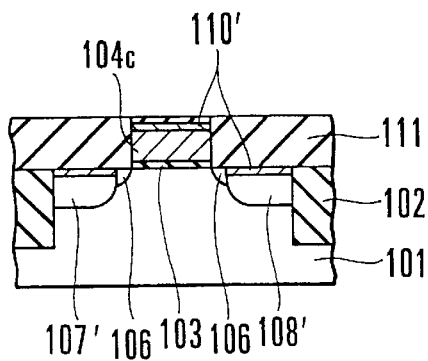

As shown in FIG. 1G, the silicon nitride is selectively etched with respect to the silicon oxide, so that the protection film 109 is removed to expose the upper surface of the lower electrode 104a.

Figure 1H:
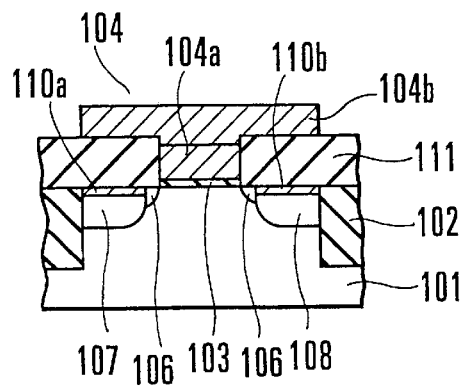
Figure 1H:
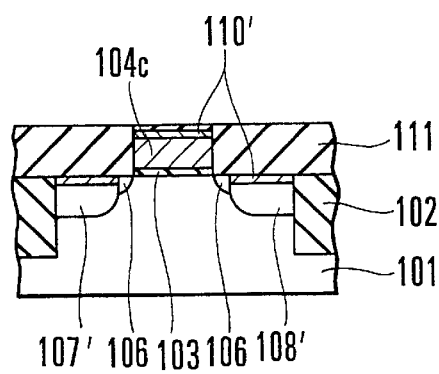

As shown in FIG. 1H, a conductive film made of polysilicon, which is a conductive material similar to the lower electrode 104a, is formed on the interlevel film 111 including the exposed upper surface of the lower electrode 104a, and is partially removed, to form an upper electrode 104b on the lower electrode 104a to be in contact with it. The lower electrode 104a and upper electrode 104b constitute a floating gate 104.

During the steps of FIGS. 1G and 1H, no change takes place in the peripheral circuit region, as shown in FIGS. 1G' and 1H'.

Figure 1I:
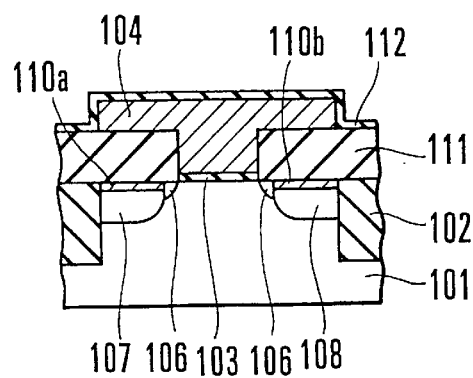
Figure 1I:
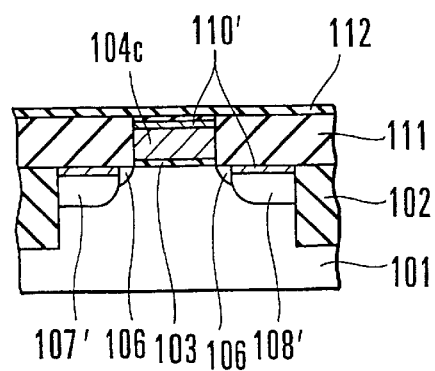

As shown in FIG. 1I, an ONO film 112 is formed on the interlevel film 111 including the upper surface of the floating gate 104. The ONO film 112 has a three-layered structure formed by sandwiching an insulating film made of silicon nitride sandwiched between silicon oxide films. In the peripheral circuit region, the ONO film 112 is formed on the interlevel film 111, as shown in FIG. 1I'.

Figure 1J:
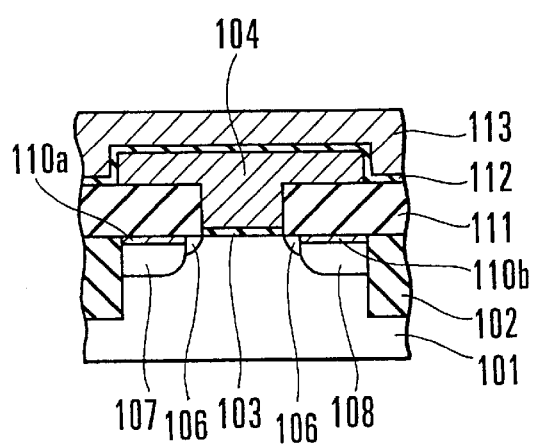
Figure 1J:
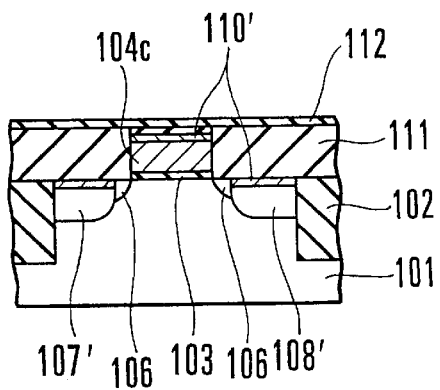

As shown in FIG. 1J, a control gate 113 is formed in the direction of gate length so as to extend across the floating gate 104. No control gate 113 is formed on the peripheral circuit region, as shown in FIG. 1J'.

An interlevel film 114 is formed on the entire surface of the semiconductor substrate 101 including the control gate 113. Thereafter, as shown in FIG. 2A, a contact 115 is formed in the region where no floating gate or control gate is formed, so as to be connected to an impurity region 108a continuous to the drain 108 through the silicide layer 110b. A bit interconnection 116 to be connected to the contact 115 is formed. The silicide layer 110a is formed on an impurity region 107a continuous to the source 107.

As a result, as shown in FIGS. 2A and 2B, the bit interconnection 116 is connected to the drain 108 of the transistor where the floating gate 104 is formed, through the contact 115 and the silicide layer 110b which is formed to extend across the drain 108 and the impurity region 108a continuous to it.

FIG. 3 shows an equivalent circuit of the memory cells of this embodiment.

As shown in FIG. 3, a region 401 surrounded by a broken line constitutes one memory cell array. A source line 402 and drain line 403 are formed in common for a plurality of memory transistors in one memory cell array.

In this embodiment, the source line 402 is constituted by the common source constituted by the source 107 described above and the impurity region 107a continuous to it, and the silicide layer 110a formed on the source 107 and impurity region 107a.

The drain line 403 is constituted by the common drain constituted by the drain 108 described above and the impurity region 108a continuous to it, and the silicide layer 110b formed on the drain 108 and silicide layer 110b.

Therefore, the common source and drain formed with the silicide layers 110a and 110b are formed in common for the respective transistors in one memory cell array, thus forming part of the bit line. The silicide layers 110a and 110b used as part of the bit line have a sheet resistance of as very low as 5 Ω/□. Therefore, as in this embodiment, in a cell array structure as well in which a plurality of memory cells have one drain in common and a silicide layer is formed on the surface of the drain to form a contact at one portion of the silicide layer on the drain region, the drain resistance does not become high even in a memory cell far from the contact, and the high-speed operation is not interfered with.

As has been described above, according to the present invention, even when a plurality of memory cells are arranged to have the common source and drain, a drain contact is formed at one portion of these plurality of memory cells, and the common drain is used as part of the bit line, a delay caused by the drain resistance is suppressed even in a memory cell far from the contact, and a higher-speed operation can be obtained.

Since the resistance of the common drain and source can be decreased, one contact required for connection with the bit line can be formed for a memory cell array formed by a group of many memory cells, so that the area of the memory cell formation region can be decreased.

Even when the upper portion of the floating gate is formed to extend over the source and drain regions, silicide layers can be formed on the source and drain.

What is claimed is:

1. A method of manufacturing a semiconductor device, comprising:

the first step of forming a gate insulating film on a semiconductor substrate of a first conductivity type;

the second step of forming a lower electrode on said gate insulating film;

the third step of doping an impurity of a second conductivity type to a surface of said semiconductor substrate on two side regions of said lower electrode and said gate insulating film, thereby forming a source and a drain;

the fourth step of forming a protection film on said lower electrode;

the fifth step of forming a silicide layer on said source and drain without forming the silicide layer on the lower electrode;

the sixth step of removing said protection film and thereafter forming an upper electrode having a T-shaped section to come into contact with an exposed upper surface of said lower electrode, thereby forming a floating gate comprising said lower and upper electrodes;

the seventh step of forming an isolation insulating film to cover said upper electrode; and the eighth step of forming a control gate on said floating gate through said isolation insulating film.

2. A method according to claim 1, wherein the fifth step comprises forming a refractory metal film on said semiconductor substrate including said protection film and lower electrode, and heating said semiconductor substrate, thereby forming said silicide layer on said source and said drain that come in contact with said refractory metal film, and the sixth step comprises forming said floating gate after removing said refractory metal film.

3. A method according to claim 2, wherein the fifth step comprises the step of forming a cobalt film as said refractory metal film on said semiconductor substrate.

4. A method according to claim 1, wherein the sixth step comprises forming an insulating film on said semiconductor substrate including said protection film and lower electrode, exposing a surface of said protection film by etching said insulating film, exposing an upper surface of said lower electrode by selectively removing said protection film, and forming said upper electrode on said insulating film and in contact with said upper surface of said lower electrode, said upper electrode being aligned over said source and drain, thereby forming said floating gate constituted by said lower and upper electrodes.

5. A method of manufacturing a semiconductor device having a memory cell with a floating gate which comprises a lower electrode and an upper electrode formed on said lower electrode in contact therewith and extending therewith to a region on a drain and a source, the method comprising the steps of:

forming a silicide layer on the surfaces of said drain and said source, after forming a protection film on said lower electrode;

forming said upper electrode on said lower electrode, after removing said protection film, wherein said semiconductor device further comprises a peripheral circuit region formed in a periphery region of said memory cell, and said protection film is not formed on a gate electrode of a transistor formed on said peripheral circuit region.

\* \* \* \* \*